United States Patent
Wu

(10) Patent No.: US 6,323,094 B1
(45) Date of Patent: *Nov. 27, 2001

(54) METHOD TO FABRICATE DEEP SUB-μM CMOSFETS

(75) Inventor: Shye-Lin Wu, Hsinchu (TW)

(73) Assignee: TSMC Acer Semiconductor Manufacturing Inc. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/345,925

(22) Filed: Jul. 1, 1999

Related U.S. Application Data

(63) Continuation-in-part of application No. 09/020,229, filed on Feb. 6, 1998, now Pat. No. 6,096,614.

(51) Int. Cl.$^7$ ................................................. H01L 21/336
(52) U.S. Cl. ............................................................ 438/303
(58) Field of Search .................................... 438/585, 592, 438/302, 203, 276, 564, 591; 427/571

(56) References Cited

U.S. PATENT DOCUMENTS

| | | | |
|---|---|---|---|
| 4,354,309 | * 10/1982 | Gardiner et al. | 438/564 |
| 4,481,229 | * 11/1984 | Suzuki et al. | 427/571 |
| 5,596,218 | * 1/1997 | Soleimani et al. | 257/369 |
| 5,629,221 | * 5/1997 | Chao et al. | 438/591 |
| 5,670,397 | * 9/1997 | Chang et al. | 438/226 |
| 5,672,521 | * 9/1997 | Barsan et al. | 438/276 |
| 5,767,004 | * 6/1998 | Balasubramanian et al. | 438/592 |
| 5,817,547 | * 10/1998 | Eom | 438/592 |
| 5,891,794 | * 4/1999 | Ibok | 438/592 |
| 6,043,142 | * 3/2000 | Nakajima et al. | 438/585 |
| 6,096,614 | * 8/2000 | Wu | 438/303 |
| 6,165,916 | * 12/2000 | Muraoka et al. | 438/791 |

OTHER PUBLICATIONS

T.S. Chao et al., Suppression of Boron Penetration in BF2+-implanted Poly–Si Gate Using N2O Oxide and stacked–Amorphous–Silicon (SAS) Structure, EDMS, pp. 5–14–2 to 5–4–16, 1994.*
S. L. Wu, High–Performance polysiicon Contacted Shallow Junctions Formed by Stacked–Amorphous–Silicon Films, IEEE Electron Device Letters, vol. 13, No. 1, Jan. 1992 pp. 23–25.*
S. L. Wu, et al., Suppression of Boron Penetration into an Ultra–Thin Gate Oxide (<7nm) by Using a Stacked–Amorphous–Silicor (SAS) Film, IEEE, International Electron Device Meeting, IEDM 93, pp. 329–332, Dec. 1993.*

* cited by examiner

Primary Examiner—Long Pham
Assistant Examiner—William David Coleman

(57) ABSTRACT

The method of the present invention is to fabricate a CMOS device without boron penetration. A nitrided gate oxide and SAS gate electrode are provided to suppress boron penetration. The nitrided gate oxide could be formed in two approaches. One of the approaches is to implant nitrogen ions into the interface between substrate and pad oxide layer, and then thermally treat the substrate for segregating the doped nitrogen ions in the surface of substrate. Removing the pad oxide layer, thermally treating the substrate in oxygen ambient for growing a gate oxide layer, the nitrided gate oxide layer is formed by incorporating doped nitrogen ions into the growing gate oxide layer. The other approach is to place the substrate having a gate oxide layer thereon in nitrogen plasma ambient, thereby forming the nitrided gate oxide layer. After the formation of nitrided gate oxide layer, at least one stacked amorphous silicon (SAS) layer is formed over the gate oxide layer. The gate structure is formed by patterning the SAS layer and nitrided gate oxide layer. Thereafter, source/drain with LDD regions are subsequently formed in the substrate. Finally, a thermal treatment is performed to convert the stacked-amorphous silicon gate into poly silicon gate and to form shallow source and drain junction in the substrate, thereby achieving the structure of the MOS device.

13 Claims, 6 Drawing Sheets

METHOD TO FABRICATE DEEP SUB-µM CMOSFETS

This application is a continuation in part application of Ser. No. 09/020,229, filed Feb. 06, 1998, now U.S. Pat. No. 6,096,614.

FIELD OF THE INVENTION

The present invention relates to a semiconductor device, and more specifically, to a method of fabricating a complementary metal oxide semiconductor field effect transistor (CMOSFET).

BACKGROUND OF THE INVENTION

Metal oxide semiconductor field effect transistors (MOSFETs) have been traditionally used and widely applied in the semiconductor technologies. For deep sub-micron high performance MOS ULSI application, as suggested in the reference "B. Davari, in IEDM Tech. Dig., p. 555, 1996.", the dual poly gate CMOS technology (p+ poly gate for PMOSFET and n+ poly gate for NMOSFET) is necessary. However, as mentioned in "Y. Taur, et al., in IEDM Tech. Dig., p. 901, 1992.", the effect of boron penetration through the thin gate oxide into silicon substrate will degrade the device performance. There are several methods to suppress the boron penetration effects, such as (1) $N_2O$ nitridation of thin gate oxide suggested in reference "E. Hasegawa, et al., in IEDM Tech. Dig., p. 327, 1995.", (2) the heavy nitrogen implantation (dosage$\geq$4E 15 cm−2) into poly-Si suggested in reference "S. Shimizu, et al., in IEDM Tech. Dig., p. 67, 1994.", and (3) the stacked-Si layer as gate material suggested in "S. L. Wu, et al., in IEDM Tech. Dig., p. 329, 1993", etc.

Although the heavy nitrogen implantation into poly-Si layer could effectively suppress the boron penetration effects, the sheet resistance of poly gate will be largely increased with increasing the nitrogen dosage for both n+ and p+ poly gates, especially for the nitrogen dosage larger than 4E15 $cm^{-2}$. This is shown in the reference "S. Shimizu, et al., J. Appl. Phys., vol. 35, p. 802, 1996.".

SUMMARY OF THE INVENTION

A first object of the present invention is to provide a method to fabricate dual gate CMOS devices without boron penetration.

A second object of the present invention is to provide a method to fabricate dual gate CMOS devices for suppressing boron penetration without serious side effects. According to the objects of the invention, two approaches are disclosed to achieve them. The approaches are illustrated as follows.

In the first approach, a pad oxide layer is formed over a substrate, and then nitrogen ions are implanted into the pad oxide layer and substrate. After the pad oxide layer removed, a gate oxide layer is formed over the substrate by thermal oxidation treatment. In the period of oxidation, the doped nitrogen ions are incorporated into the gate oxide layer, thereby forming a nitrided gate oxide layer as a diffusion barrier to suppress boron penetration. After the formation of the nitrided gate oxide layer, at least one amorphous silicon layer is stacked on the nitrided gate oxide layer. Through patterning the stacked amorphous silicon (SAS) layer and nitrided gate oxide layer, a gate structure is formed, then forming source/drain with LDD regions in the substrate. Finally, by thermal treatment, the gate structure of SAS layer is converted into poly gate and the shallow junctions of the source/drain are formed.

In the other approach, a substrate with a gate oxide layer thereon, is placed in nitrogen plasma ambient, such as ICP and EVR system, thereby forming a nitrided gate oxide layer over the substrate. After the nitrided gate oxide formed, at least one SAS layer is stacked on the nitrided gate oxide layer. Thereafter, following the above procedure, source/drain/gate structures are formed in or on the substrate.

Therefore, summing up both the embodiments, the invention provides benefits of improving the gate reliability and without increasing the gate resistance dramatically, due to the formation of nitrided gate oxide and SAS gate electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1(A) is a cross-sectional view of a semiconductor substrate illustrating the step of growing a pad oxide layer on a semiconductor substrate according to the present invention;

FIG. 1(B) is a cross-sectional view of the semiconductor substrate illustrating the step of lightly implanting nitrogen ions into the pad oxide layer and substrate according to the present invention;

FIG. 1(C) is a cross-sectional view of the semiconductor substrate illustrating the step of forming a gate oxide layer on the semiconductor substrate and subsequently forming stacked-amorphous silicon (SAS) layers on the gate oxide layer;

FIG. 1(D) is a cross-sectional view of the semiconductor substrate illustrating the step of defining a gate region and then performing a LDD implantation according to the present invention;

FIG. 1(E) is a cross-sectional view of the semiconductor substrate illustrating the step of forming dielectric spacers and then performing S/DIG implantation according to the present invention;

FIG. 1(F) is a cross-section view of the semiconductor substrate illustrating the step of performing a high temperature thermal treatment to form shallow junctions of source and drain structures according to the present invention;

FIG. 2(A) is a cross-sectional view of a semiconductor substrate illustrating the step of growing a nitrided gate oxide layer on a semiconductor substrate according to the present invention;

FIG. 2(B) is a cross-sectional view of the semiconductor substrate illustrating the step of forming stacked-amorphous-silicon (SAS) layers on the nitrided gate oxide layer according to the present invention;

FIG. 2(C) is a cross-sectional view of the semiconductor substrate illustrating the step of defining poly-Si gate and then performing LDD implantation according to the present invention; FIG. 2(D) is a cross-sectional view of the semiconductor substrate illustrating the step of forming dielectric spacers and then performing S/DIG implantation according to the present invention; and FIG. 2(E) is a cross-sectional view of the semiconductor substrate illustrating the step of performing a high temperature thermal treatment to form shallow junctions of source and drain structures according to the present invention.

DETAILED DESCRIPTION OF THE PREFERRED EMBODIMENT

The present invention will be described in detail with reference to drawings. The purpose of the present invention is to provide a method for fabricating dual gate CMOS devices without boron penetration. For clearly illustrating the present invention, two detailed embodiments will be described as follows.

FIG. 1(A)~FIG. 1(F) show the first embodiment of the present invention. By means of implanting nitrogen ions into the semiconductor substrate and pad oxide layer, the implanted nitrogen ions would be incorporated into the subsequently formed gate oxide layer as a diffusion barrier for preventing boron atoms doped in gate electrode from diffusing into gate oxide and substrate. The detailed processes of the first embodiment are then illustrated in the following paragraphs.

Figure 1A:
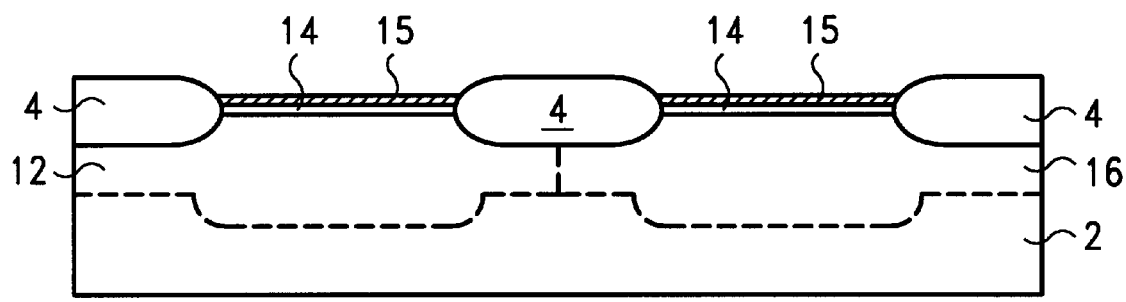
FIG. 1(A)~FIG. 1(F) illustrate the drawings of the first embodiment of the present invention.

Please refer to FIG. 1(A). In this preferred embodiment, a single crystal silicon substrate 2 with a <100> crystallographic orientation is provided. Pad oxide layer 14 is preferably formed over substrate 2 by thermal oxidation of substrate 2, thereby growing a thickness from about 50~200 angstroms. Nitrided silicon layer 15 is then formed over pad oxide layer 14 by conventional methods in the art, such as LPCVD. Through pattering pad oxide layer 14 and nitrided silicon layer 15, a plurality of active areas is defined on surface of substrate 2. For isolating these active areas, thick field oxide (FOX) regions 4 are formed on substrate 2 by placing substrate 2 in an oxygen-steam ambient and performing thermal oxidation. Thereafter, FOX regions 4 would grow in a thickness from about 3000 to 8000 angstroms to isolate the electric devices of substrate 2. As for the well-known conventional methods in the art, FOX regions 4 could also be replaced by a plurality of shallow trench isolations. In this preferred embodiment, for forming the structure of CMOSFET, a twin well structure (include a P-well 12 and N-well 16) in the substrate 2 is then formed in substrate 2 by conventional methods, such as ion implantation and diffusion.

Figure 1B:
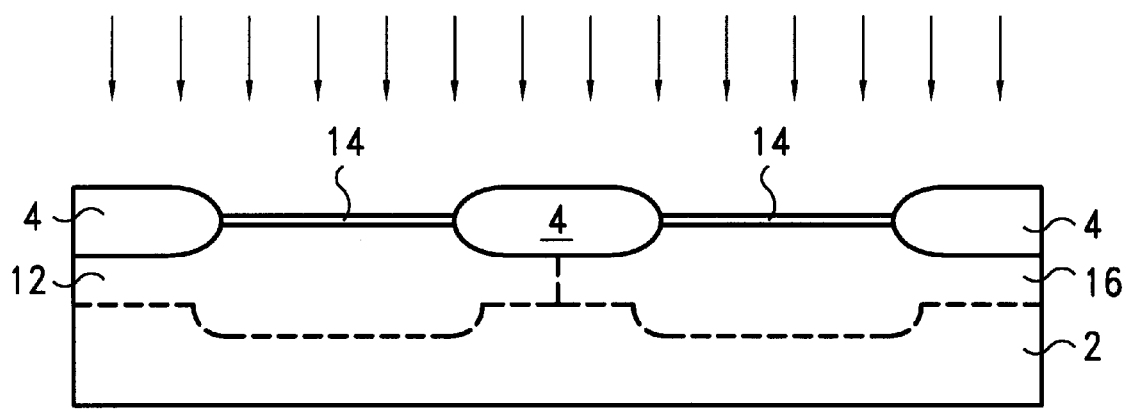

Referring to FIG. 1(B), after the formation of the twin well, nitrided silicon layer 15 is stripped by using standard methods such as wet etching and dry etching. After then, nitrogen ions are accelerated by electric fields and implanted into pad oxide layer 14 and the surface of substrate 2. The nitrogen ion implantation is preferably for forming a diffusion barrier to suppress boron penetration, in which boron atoms doped in gate electrode penetrate into its gate oxide and substrate, thereby degrading the gate reliability and device performance. Since the nitrogen will act as a diffusion barrier in gate structure, the implantation would be performed in a comparatively low energy between 5 ~30 KeV and the dosage of implantation would fall in a lightly range of fewer than $5 \times 10^{14}$ ions/cm$^2$. After the nitrogen implantation, the substrate 2 is thermally treated at the temperature from about 700~1000° C. so as to drive the doped nitrogen ions segregated in pad oxide layer 14 into the surface of substrate 2. It is noticed that pad oxide layer 14, which does not be removed accompany with the nitrided silicon layer 15, could serve as a screen layer to avoid channel effect while implanting the nitrogen ions.

Figure 1C:
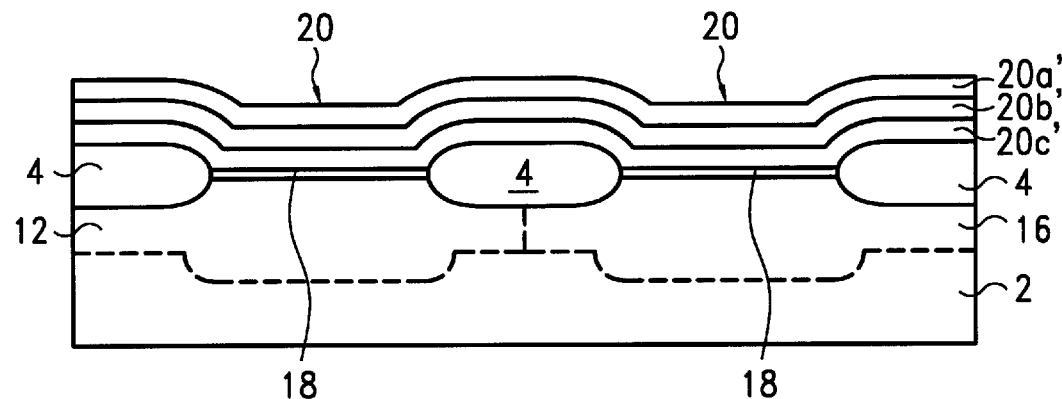

Referring to FIG. 1(C), after the nitrogen ion implantation and thermal treatment, pad oxide layer 14 is then preferably removed by using conventional methods, for instance, wet etching it with hydrofluoric acid. Thereafter, the surface of substrate 2 is cleaned through conventional processes in general known in the art. For forming a silicon dioxide layer to be the gate oxide layer, substrate 2 is thermally treated in oxygen environment at a temperature of about 700 to 1100° C., thereby growing gate oxide layer 18 over the surface of substrate 2 in the process of oxidation. Meanwhile, the doped nitrogen ions segregated in the surface of substrate 2 would be incorporated into the growing gate oxide layer 18 and drive it into nitrided gate oxide layer. Since nitrided gate oxide layer 18 has better properties, such as improved gate reliability for suppressing boron penetration, than pure oxide layer does, the thickness of nitrided gate oxide layer 18 could be fabricated thinner than before. In this preferred embodiment, nitrided gate oxide 18 could be formed as an ultra-thin layer, whose thickness falls in the range from about 10 to 100 angstroms. Subsequently, at least one amorphous silicon layer is formed over nitrided gate oxide layer 18 by methods, such as CVD, LPCVD, as well known in the art. In this preferred embodiment, three amorphous silicon layers 20c', 20b' and 20a' are stacked on the surface of nitrided gate oxide layer 18 and FOX regions 4 to compose a stacked amorphous-Si (SAS) film 20. Each amorphous-Si layer 20c', 20b' or 20a' has suggested but is not limited to a thickness between about 200 to 1000 angstroms. As for the exact process conditions, they depend on desired outcomes and purposes, which vary form case to case, and for illustrating clearly, those conditions would not be shown in this paragraph.

Figure 1D:
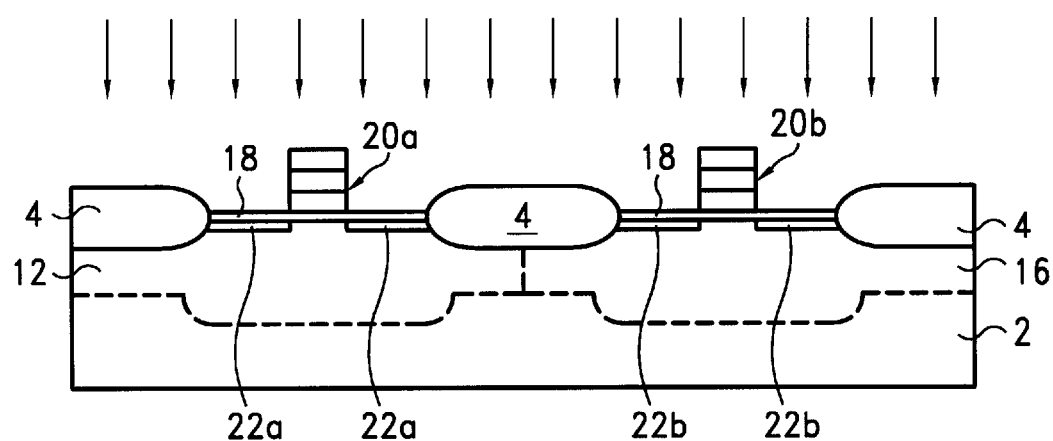

Turning to FIG. 1(D), stacked-amorphous-silicon layer 20 is etched back to form stacked-amorphous-silicon gate 20a, and 20b on the top of P-well 12 and N-well 16, respectively. Then, a first lightly doped drain (LDD) implantation is carried out to form lightly doped source and drain regions 22a in P-well 12 by using a first photoresist layer covered over the N-well region as a mask. In this preferred embodiment, the dopant is B or BF$_2$, the dosage is about $10^{12}$ to $10^{14}$ ions/cm$^2$, and the implant energy is about 5 to 120 KeV. The first photoresist layer is then removed. A quite similar way is carried out to form lightly doped source and drain regions 22b in the N-well 16 by using a second photoresist layer covered over the P-well as an implant mask. In this preferred embodiment, the dopant is P, As, or As/P, the dosage is about $10^{12}$ to $10^{14}$ ions/cm$^2$, and the implant energy is about 5 to 120 KeV. After forming the lightly doped source and drain regions 22b in the N-well, the second photoresist layer is removed.

Figure 1E:
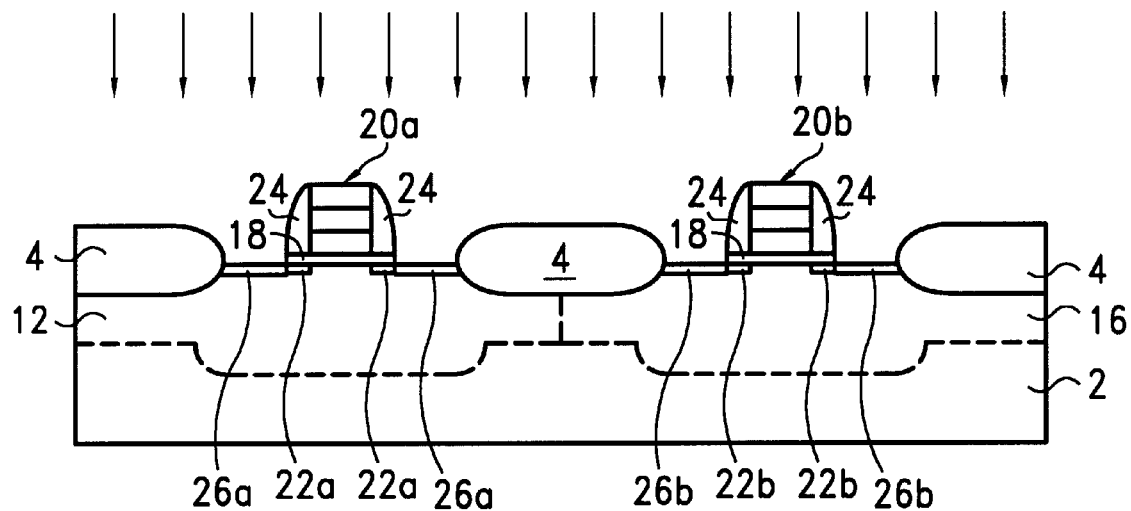
Figure 1F:
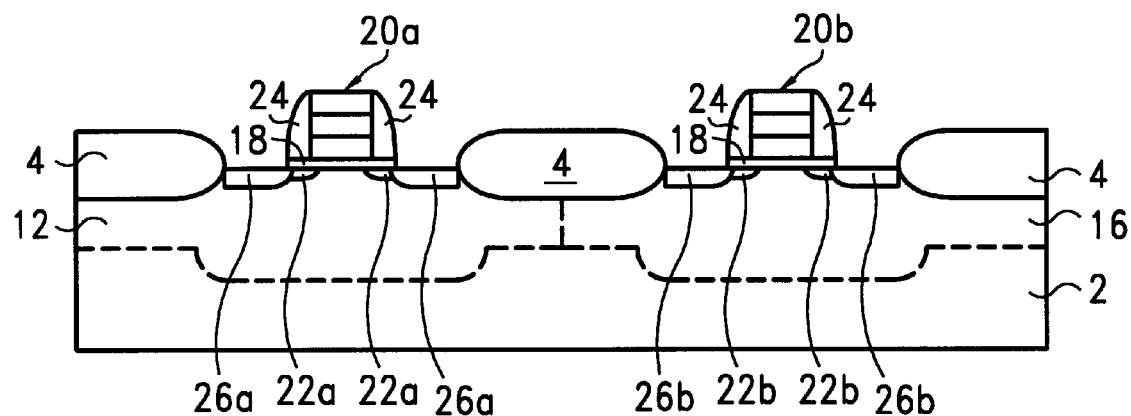

Referring to FIG. 1(E), dielectric layer 24 is deposited over stacked-amorphous-silicon gate 20a, 20b, FOX regions 4, and nitrided gate oxide layer 18. In the preferred embodiment, the dielectric layer is formed by chemical vapor deposition process. Next, an anisotropic etching is performed on the dielectric layer to form dielectric side-wall spacers 24 on the side walls of each gate 20a, 20b. Following the formation of side wall spacers 24, a first S/DIG implant is performed to implant impurities into the stacked-amorphous-silicon gate 20a atop the P-well 12, and into the P-well 12 to form source and drain regions 26a in P-well 12 by using a third photoresist layer covered over the N-well as an implant mask. In this preferred embodiment, the dopant is As or As/P, the dosage is from about $10^{14}$ to $10^{16}$ ions/cm$^2$, and the implant energy is about 0.5 to 80 KeV. The third photoresist layer is then removed. A quite similar way is carried out to form source and drain regions 26b in the N-well 16 by using a fourth photoresist layer covered over the P-well 12 as an implant mask. In this preferred embodiment, the dopant is B or BF$_2$, the dosage is from about $10^{14}$ to $10^{16}$ ions/cm$^2$, and the implant energy is about 0.5 to 80 KeV. After forming the source and drain regions 26b in the N-well 16, the fourth photoresist layer is removed.

Referring to FIG. 1 (F), a high temperature thermal treatment is used to form shallow junctions 26a and 26b in P-well 12 and N-well 16, respectively. In this preferred embodiment, the high temperature thermal treatment is performed at a temperature about 700 to 1050 centigrade degrees for 0.1–60 minutes. In this period, stacked-amorphous-silicon gates 20a and 20b are transformed to polycrystalline phase so as to be the gate electrodes of the CMOSFET. As shown in the figure, a dual poly gate CMOSFET with a p+ polysilicon gate for PMOSFET and a n+ polysilicon gate for NMOSFET are hereby formed.

It is noticed that, in this preferred embodiment, the gate structure of CMOSFET having nitrided gate oxide layer, which is formed in a comparatively light dosage, in conjunction with SAS layers, could effetely prevent boron dopants of gate electrode from diffusing into gate oxide and substrate, thereby improving the gate reliability. Furthermore, the lightly doped nitrogen ions would not increase the gate resistance dramatically, therefore providing the gate structure optimized properties between gate reliability and gate resistance.

FIG. 2(A)–FIG. 2(E) show the second embodiment of the present invention. This embodiment provides a different approach of introducing nitrogen plasma to from a nitrided gate oxide layer to suppress boron penetration. In addition, SAS layers are successively formed over the nitrided gate oxide layer and then converted into poly gate electrode by thermal treatment. The detailed processes of the second embodiment are illustrated thereafter in the following paragraphs.

Figure 2A:
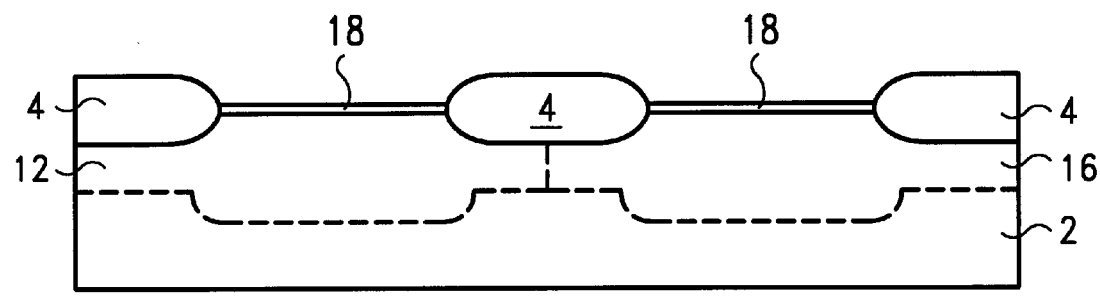
FIG. 2(A)~FIG. 2(E) illustrate the drawings of the second embodiment of the present invention.

Referring to FIG. 2(A), a single crystal silicon substrate 2 with a <100> crystallographic orientation is provided. A plurality of thick field oxide (FOX) regions 4 is formed to provide isolation between devices on the substrate 2. In this preferred embodiment, FOX regions 4 can be formed via patterning a silicon nitride-silicon dioxide composite layer and placing substrate 2 in an oxygen-steam environment to grow the FOX region 4 in a thickness from about 3000 to 8000 angstroms. However, as well known in the art, FOX region 4 can also be replaced by a plurality of shallow trench isolations and other alternatives. In addition, for forming the structure of CMOSFET, a twin well structure (include a P-well 12 and N-well 16) in the substrate 2 is then formed in substrate 2 by conventional methods, such as ion implantation and diffusion.

After the twin well formed and the silicon nitride-silicon dioxide composite layer removed, a silicon dioxide layer 18 is formed on the top surface of the substrate 2 to serve as a gate oxide layer. Typically, gate oxide layer 18 is formed in oxygen ambient at a temperature from about 700 to 1100° C. In this embodiment, the thickness of the silicon dioxide layer is approximately 15 to 250 angstroms. For forming a diffusion barrier to suppress boron penetration, substrate 2 is treated in an ambient of Inductively Coupled Plasma (ICP) or Electron Cyclotron Resonance (ECR) system for introducing nitrogen plasma to form a nitrided gate oxide layer 18.

Figure 2B:
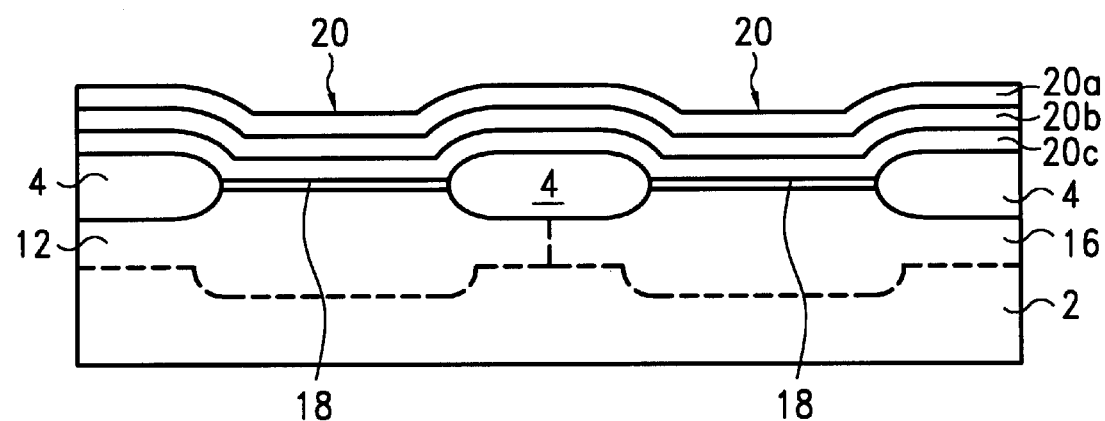

Referring to FIG. 2(B), subsequently, at least one amorphous silicon layer is formed over nitrided gate oxide layer 18 by methods, such as CVD, LPCVD, as well known in the art. In this preferred embodiment, three amorphous silicon layers 20c', 20b' and 20a' are stacked on the surface of nitrided gate oxide layer 18 and FOX regions 4 to compose a stacked amorphous-Si (SAS) film 20. Each amorphous-Si layer 20c', 20b' or 20a' has suggested but is not limited to a thickness between about 200 to 1000 angstroms.

Figure 2C:
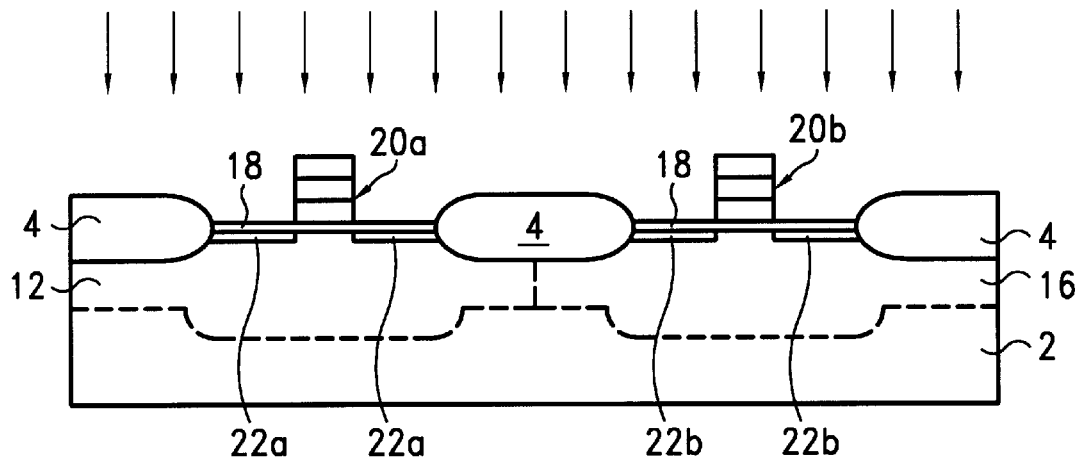
Figure 2D:
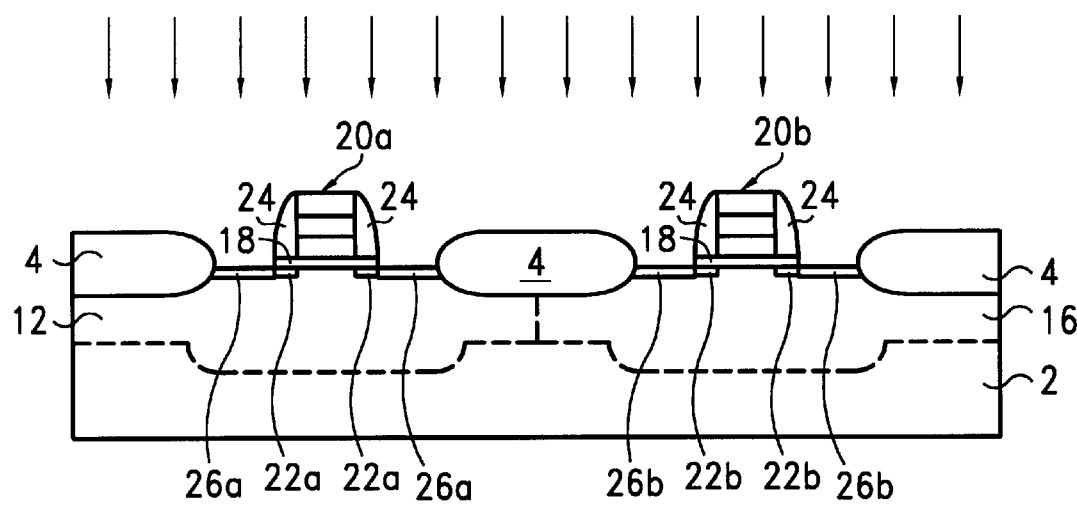
Figure 2E:
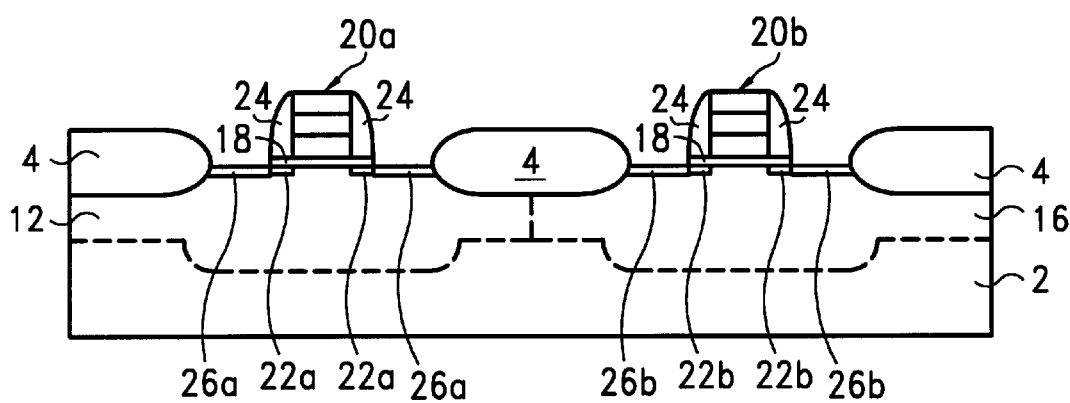

Referring to FIG. 2(C), stacked-amorphous-silicon layer 20 is etched back to form stacked-amorphous-silicon gate 20a, and 20b on the top of P-well 12 and N-well 16, respectively. Then, a lightly doped drain (LDD) implantation is carried out to form lightly doped source and drain regions 22a and 22b separately. After the formation of lightly doped source and drain regions 22a and 22b, turning to FIG. 2(D), side-wall spacers 24 are formed to encompass gate structures 20a and 20b, and source and drain structures 26a and 26b are formed by implanting impurities into substrate 2. Finally referring to FIG. 2(E), through a high temperature thermal treatment, shallow junctions of source and drain structures 26a and 26b are respectively achieved in P-well 12 and N-well 16. Meanwhile, SAS gate structures 20a and 20b are transformed to polycrystalline phase so as to be the gate electrodes of the CMOSFET. As shown in the figure, a dual poly gate CMOSFET with a p+ polysilicon gate for PMOSFET and a n+ polysilicon gate for NMOSFET are hereby formed. Since, in this paragraph, the methods and process conditions to fabricate the above CMOSFET are identical with those of the first embodiment, the details would not be further discussed here.

It is also noticed that in this embodiment both the nitrided gate oxide layer and gate electrode, which is turned from SAS layers, are helpful to suppress boron penetration as well as improve gate resistance.

Summing up both the embodiments, the invention provides benefits of (1) the device reliability could be improved by using the dual poly gate CMOS technology; (2) the boron penetration effects in p+ poly gate pMOSFETs could be fully suppressed by combining the nitrogen doping technology and the stacked-Si layer as gate material; and (3) the side effects of the heavy nitrogen ion implantation could be avoided.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiments of the invention have been illustrated and described, it will be appreciated that various changes can be made therein without departing from the spirit and scope of the invention. For example, this method that we proposed for fabricating ultra-short channel nMOSFETs devices with self-aligned silicided contact also can use in fabricating pMOFETS or CMOSFETs.

What is claimed is:

1. A method for fabricating a P-type metal oxide semiconductor field effect transistor in a semiconductor substrate, said method comprising the steps of:

forming a pad oxide layer on said substrate;

implanting diffusion barrier ions into said substrate and said pad oxide layer;

first thermally treating said substrate, for segregating said diffusion barrier ions into surface of said substrate;

removing said pad oxide layer;

forming gate oxide layer over said substrate, thereby incorporating said diffusion barrier ions into said gate oxide layer for serving as a diffusion barrier;

forming at least one amorphous silicon layer over said gate oxide layer as a stacked-amorphous silicon layer;

patterning said stacked-amorphous silicon layer for forming a gate structure;

implanting P-type ions into said gate structure and said substrate adjacent to said gate structure to form source and drain structure; and second thermally treating said gate structure and said substrate, thereby converting said stacked-amorphous silicon gate into poly silicon gate and achieving shallow source and drain junctions in said substrate as well as for suppressing boron penetration.

2. The method of claim 1, further comprising follow steps before forming said source and drain structure:

implanting ions into said substrate, thereby forming doped regions to serve as lightly doped source and drain of said transistor;

forming a dielectric layer over said gate structure; and etching said dielectric layer to form side-wall spacers encompassed said gate structure.

3. The method of claim 1, wherein said diffusion barrier ions comprise nitrogen ions.

4. The method of claim 3, wherein said nitrogen ions are implanted in a dosage fewer than $5 \times 10^{14}$ ions/cm$^2$, and implantation energy from about 5 to 30 KeV.

5. The method of claim 1, wherein said gate oxide layer has a thickness from about 10 to 100 Angstroms.

6. The method of claim 1, wherein said pad oxide layer has a thickness from about 50 to 200 Angstroms.

7. The method of claim 1, wherein said step of first thermal treatment is performed at a temperature between about 700~1000° C.

8. The method of claim 1, wherein said stacked-amorphous silicon layer is essentially consisted of stacking three amorphous silicon layers, in which each said amorphous silicon layer has a thickness from about 200 to 1000 Angstroms.

9. A method for fabricating a P-type metal oxide semiconductor field effect transistor in a semiconductor substrate, said method comprising the steps of:

forming a gate oxide layer on said substrate; nitriding said gate oxide layer by introducing nitrogen plasma, thereby forming a nitrided gate oxide layer for serving as a diffusion barrier;

forming at least one amorphous silicon layer over said nitrided gate oxide layer as a stacked-amorphous silicon layer;

pattering said stacked-amorphous silicon layer for forming a gate structure;

implanting P-type ions into said gate structure and said substrate adjacent to said gate structure to form source and drain structure; and thermally treating said gate structure and said substrate, thereby converting said stacked-amorphous silicon gate into poly silicon gate and achieving shallow source and drain junctions in said substrate as well as for suppressing boron penetration.

10. The method of claim 9, further comprising follow steps before forming said source and drain structure:

implanting ions into said substrate, thereby forming doped regions to serve as lightly doped source and drain of said transistor;

forming a dielectric layer over said gate structure; and etching said dielectric layer to form side-wall spacers encompassed said gate structure.

11. The method of claim 9, wherein said nitrogen plasma is provided by Inductively Coupled Plasma (ICP).

12. The method of claim 9, wherein said nitrogen plasma is provided by Electron Cyclotron Resonance (ECR) plasma.

13. The method of claim 9, wherein said stacked-amorphous silicon layer is essentially consisted of stacking three amorphous silicon layers, in which each said amorphous silicon layer has a thickness from about 200 to 1000 Angstroms.

* * * * *

UNITED STATES PATENT AND TRADEMARK OFFICE
CERTIFICATE OF CORRECTION

PATENT NO. : 6,323,094 B1
DATED : November 27, 2001
INVENTOR(S) : Wu

It is certified that error appears in the above-identified patent and that said Letters Patent is hereby corrected as shown below:

Title page,
Item [57], ABSTRACT,
Please insert:

-- The method of the present invention is to fabricate a CMOS device without boron penetration. A nitrided gate oxide and SAS gate electrode are provided to suppress boron penetration. The nitrided gate oxide could be formed in two approaches. One of the approaches is to implant nitrogen ions into the interface between the substrate and the pad oxide layer, and then thermally treat the substrate for segregating the doped nitrogen ions in the surface of substrate. Removing the pad oxide layer, thermally treating the substrate in oxygen ambient for growing a gate oxide layer, the nitrided gate oxide layer is formed by incorporating doped nitrogen ions into the growing gate oxide layer. The other approach is to place the substrate having a gate oxide layer thereon in nitrogen plasma ambient, thereby forming the nitrided gate oxide layer. After the formation of the nitrided gate oxide layer, at least one stacked amorphous silicon (SAS) layer is formed over the gate oxide layer. The gate structure is formed by patterning the SAS layer and nitrided gate oxide layer. Thereafter, source/drain with LDD regions are subsequently formed in the substrate. Finally, a thermal treatment is performed to convert the stacked-amorphous silicon gate into the poly silicon gate and to form shallow source and drain junction in the substrate, thereby achieving the structure of the MOS device.

Column 1,
Line 19, after "reference" insert -- by -- and delete the quotation mark; after "Davari," insert -- appearing --.
Line 20, delete ["].
Line 22, after "in", first occurrence, insert -- the reference by -- and delete the quotation mark; after "et al.," insert -- appearing --.
Line 23, delete quotation mark.
Line 27, insert -- the -- after "in" and insert -- by -- after "reference" then delete the quotation mark.
Line 28, after "et al.," insert -- appearing --; delete the quotation mark.
Line 30, after "in", first occurrence, insert -- the -- and after "reference" insert -- by --, then delete the quotation mark.

UNITED STATES PATENT AND TRADEMARK OFFICE
CERTIFICATE OF CORRECTION

PATENT NO. : 6,323,094 B1
DATED : November 27, 2001
INVENTOR(S) : Wu

It is certified that error appears in the above-identified patent and that said Letters Patent is hereby corrected as shown below:

Column 1 cont'd.
Line 31, delete the quotation mark.
Line 32, after "in", first occurrence, insert -- the reference by -- and delete the quotation mark; then insert -- appearing -- after "et al.,"
Line 33, after "1993" delete the quotaton mark and delete ", etc."; then insert -- . --.
Line 36, after "of" insert -- the --.
Line 39, after "reference" insert -- by -- and delete the quotation mark.
Line 40, after "et al.," insert -- appearing in -- and delete the quotation mark and delete the last "."
Line 49, begin a new paragraph after "effects."
Line 54, after "and" insert -- the --.
Line 56, delete "In" and insert -- During --.

Column 2,
Line 2, delete "," first occurrence"
Line 18, insert -- generally -- before "illustrate" and delete "drawings of the".
Line 20, insert -- generally -- before "illustrate" and delete "drawings of the".
Line 44, replace "cross-section" with -- cross-sectional --

Column 3,
Line 4, after "to" insert -- the --.
Line 11, after "and" insert -- the --.
Line 15, after "into" insert -- the -- and after "and" insert -- the --.
Line 27, before "surface" insert -- the --.
Line 43, delete "After then" and insert -- Thereafter --.
Line 46, delete "preferably" and insert -- preferable --.
Line 48, after "in" insert -- the --.
Line 50, after "Since" delete "the"
Line 51, after "in" insert -- the --.
Line 53, delete "lightly" and insert -- light --.
Line 55, delete "the", second occurrence and insert -- a --.
Line 59, delete "does" and insert -- is --; delete "be" and insert -- necessarily --; delete "accompany" and insert -- along --.
Line 61, delete "the".

UNITED STATES PATENT AND TRADEMARK OFFICE
CERTIFICATE OF CORRECTION

PATENT NO.    : 6,323,094 B1
DATED         : November 27, 2001
INVENTOR(S)   : Wu It is certified that error appears in the above-identified patent and that said Letters Patent is hereby corrected as shown below:

Column 3 cont'd.
Line 61, delete "the".
Line 64, delete "by".
Line 66, delete "in".
Line 67, delete "general" and insert -- as is --.

Column 4,
Line 9, after "than" insert -- a --.
Line 16, before "well" insert -- is --.
Line 24, delete "form" and insert -- from --.
Line 48, after "by" insert -- a --.

Column 5,
Line 13, after "having" insert -- a --.
Line 15, delete "effetely" and insert -- effectively --.
Line 16, after "of" insert -- the -- and after "into" insert -- the --.
Line 17, before "substrate" insert -- the --.
Line 24, delete "from" and insert -- from --.
Line 27, after "and" insert -- are --; after "into" insert -- a --.
Line 37, after "and" insert -- by --.
Line 39, after "as" insert -- is --.
Line 46, after "well" insert -- is --.
Line 47, after "layer" insert -- is --.
Line 61, before "well" insert -- is --.

Column 6,
Line 22, delete "would not be" and insert -- are --.
Line 24, after "and" insert -- the --.
Line 26, after "as" insert -- to --.
Line 28, after "(1)" delete "the" and insert -- improved --; delete "could be improved".
Line 29, after "(2)" insert -- full suppression of --.
Line 30, delete "could be fully".
Line 31, delete "suppressed".
Line 32, after "(3)" insert -- avoidance of --.

UNITED STATES PATENT AND TRADEMARK OFFICE
CERTIFICATE OF CORRECTION

PATENT NO. : 6,323,094 B1
DATED : November 27, 2001
INVENTOR(S) : Wu

It is certified that error appears in the above-identified patent and that said Letters Patent is hereby corrected as shown below:

<u>Column 6 cont'd.</u>
Line 33, after "implantation" delete "could be".
Line 34, delete "avoided".
Line 37, delete "that" and delete "illustrated" and insert -- illustrative --.
Line 38, delete "It is" and insert -- They are --.
Line 43, replace "structure" with -- structures --.
Line 50, delete "use" and insert -- be used -- and delete "pMOFETS" and insert
-- pMOSFETS --

Signed and Sealed this

Ninth Day of July, 2002

Attest:

*Attesting Officer*

JAMES E. ROGAN
*Director of the United States Patent and Trademark Office*